(12) United States Patent
Lin

(10) Patent No.: US 10,826,624 B1
(45) Date of Patent: Nov. 3, 2020

(54) METHOD AND APPARATUS FOR TESTING BLUETOOTH RADIATION PERFORMANCE AND STORAGE MEDIUM

(71) Applicant: BEIJING XIAOMI MOBILE SOFTWARE CO., LTD., Beijing (CN)

(72) Inventor: Sheng Lin, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 16/699,043

(22) Filed: Nov. 28, 2019

(30) Foreign Application Priority Data

Aug. 30, 2019 (CN) .......................... 2019 1 0817125

(51) Int. Cl.
| H04B 17/10 | (2015.01) |
| G01R 29/10 | (2006.01) |
| H04W 4/80 | (2018.01) |
| H04B 17/00 | (2015.01) |
| H04B 17/15 | (2015.01) |
| H04B 17/29 | (2015.01) |
| H04B 7/10 | (2017.01) |
| H04W 84/12 | (2009.01) |

(52) U.S. Cl.
CPC ......... *H04B 17/102* (2015.01); *G01R 29/105* (2013.01); *H04B 7/10* (2013.01); *H04B 17/0085* (2013.01); *H04B 17/15* (2015.01); *H04B 17/29* (2015.01); *H04W 4/80* (2018.02); *H04W 84/12* (2013.01)

(58) Field of Classification Search
CPC ...... H04B 17/102; H04B 17/15; H04B 17/29; H04B 7/10; H04B 17/0085; H04W 4/80; H04W 84/12; G01R 29/105

USPC ....................................................... 455/67.12
See application file for complete search history.

(56) References Cited

U.S. PATENT DOCUMENTS

| 2004/0192222 A1* | 9/2004 | Vaisanen | H04B 1/3805 455/78 |
| 2010/0240317 A1* | 9/2010 | Giles | H04B 17/309 455/67.13 |
| 2015/0331022 A1 | 11/2015 | Bai | |

FOREIGN PATENT DOCUMENTS

| CN | 110350988 | * 10/2019 | ........... H04B 17/102 |
| EP | 2285154 A1 | 2/2011 | |

OTHER PUBLICATIONS

Extended European search report of counterpart EP application No. 19219236.7 dated Jul. 14, 2020.

* cited by examiner

*Primary Examiner* — Lee Nguyen
(74) *Attorney, Agent, or Firm* — Syncoda LLC; Feng Ma

(57) ABSTRACT

A method for testing Bluetooth radiation performance of a terminal includes: acquiring first-type radiation parameters under various test conditions; acquiring a second-type radiation parameter under a first test condition; determining second-type radiation parameters under other test conditions according to the first-type radiation parameters under the various test conditions and the second-type radiation parameter under the first test condition; and determining a total Bluetooth radiation performance parameter of the terminal according to the second-type radiation parameter under the first test condition and the second-type radiation parameters under the other test conditions.

20 Claims, 6 Drawing Sheets

METHOD AND APPARATUS FOR TESTING BLUETOOTH RADIATION PERFORMANCE AND STORAGE MEDIUM

CROSS-REFERENCE TO RELATED APPLICATIONS

The present application claims priority to Chinese Patent Application No. 201910817125.6, filed Aug. 30, 2019, the disclosure of which is hereby incorporated by reference in its entirety.

BACKGROUND

With the constant development of communication technology, a Bluetooth radiation performance test technology is increasingly demanded.

A test method for Bluetooth radiation performance of terminals nowadays is to test Bluetooth radiation performance and reception performance respectively. To be specific, an integrated tester is used to scan the Bluetooth of the terminal at various angles under horizontal polarization and vertical polarization, and respectively test effective isotropic radiated power (EIRP) values at various angles under the horizontal polarization and the vertical polarization. Then, the Bluetooth total radiated power (TRP) value is calculated by a formula, wherein the TRP value represents the Bluetooth radiation performance of the terminal. Correspondingly, effective isotropic sensitivity (EIS) values at various angles under the horizontal polarization and vertical polarization may further be tested respectively, and then the Bluetooth total isotropic sensitivity (TIS) value is calculated by a formula, wherein the TIS value represents the Bluetooth reception performance of the terminal.

SUMMARY

At least one embodiment of the present disclosure provides a method for testing Bluetooth radiation performance of a terminal, wherein an antenna circuit used when the terminal operates in a wireless fidelity (Wi-Fi) 2.4G mode is same as an antenna circuit used when the terminal operates in a Bluetooth mode, and the method includes:

when the terminal operates in the Wi-Fi 2.4G mode, acquiring first-type radiation parameters on a first channel under respective test conditions, wherein the test conditions include a channel polarization direction and a spatial position of a test point with respect to the terminal;

when the terminal operates in the Bluetooth mode, acquiring a second-type radiation parameter on a second channel under a first test condition, wherein the first test condition is one of the respective test conditions;

according to the first-type radiation parameters on the first channel under the respective test conditions, and the second-type radiation parameter on the second channel under the first test condition, determining second-type radiation parameters on the second channel under other test conditions when the terminal operates in the Bluetooth mode, wherein the other test conditions include remaining of the respective test conditions other than the first test condition in the respective test conditions; and according to the second-type radiation parameter on the second channel under the first test condition and the second-type radiation parameters on the second channel under the other test conditions, determining a total Bluetooth radiation performance parameter of the terminal.

In some embodiments, the channel polarization direction includes a horizontal polarization direction and a vertical polarization direction; and the spatial position of the test point with respect to the terminal includes an angle of the test point in a horizontal direction with respect to the terminal, and an angle of the test point in a vertical direction with respect to the terminal.

In some embodiments, the method further includes the following steps before acquiring a second-type radiation parameter on a second channel under a first test condition when the terminal operates in the Bluetooth mode:

determining a target parameter from the first-type radiation parameters on the first channel under the respective test conditions; and acquiring a test condition corresponding to the target parameter as the first test condition.

In some embodiments, determining a target parameter from the first-type radiation parameters on the first channel under the respective test conditions includes:

determining the maximum value in the first-type radiation parameters on the first channel under the respective test conditions as the target parameter.

In some embodiments, according to the first-type radiation parameters on the first channel under the respective test conditions, and the second-type radiation parameter on the second channel under the first test condition, determining second-type radiation parameters on the second channel under other test conditions when the terminal operates in the Bluetooth mode includes:

determining a parameter ratio of a first-type radiation parameter on the first channel under the first test condition to the second-type radiation parameter on the second channel under the first test condition; and determining the second-type radiation parameters on the second channel under the other test conditions according to the parameter ratio and the first-type radiation parameters on the first channel under the other test conditions.

In some embodiments, the first-type radiation parameters and the second-type radiation parameters are effective isotropic radiated power (EIRP); and the total Bluetooth radiation performance parameter is Bluetooth total radiated power (TRP);

or the first-type radiation parameters and the second-type radiation parameters are effective isotropic sensitivity (EIS); and the total Bluetooth radiation performance parameter is Bluetooth total isotropic sensitivity (TIS).

In some embodiments, a test environment for the first-type radiation parameters on the first channel under the respective test conditions is same as a test environment for the second-type radiation parameter on the second channel under the first test condition.

In some embodiments, a difference value between frequencies corresponding to the first channel and the second channel respectively is less than a specified difference value.

In some embodiments, the first channel is channel 1 in the Wi-Fi 2.4G mode and the second channel is channel 0 in the Bluetooth mode;

or the first channel is channel 6 in the Wi-Fi 2.4G mode or channel 7 in the Wi-Fi 2.4G mode, and the second channel is channel 39 in the Bluetooth mode;

or the first channel is channel 11 in the Wi-Fi 2.4G mode or channel 13 in the Wi-Fi 2.4G mode, and the second channel is channel 78 in the Bluetooth mode.

At least one embodiment of the present disclosure provides an apparatus for testing Bluetooth radiation performance of a terminal, wherein an antenna circuit used when the terminal operates in a wireless fidelity (Wi-Fi) 2.4G mode is same as an antenna circuit used when the terminal operates in a Bluetooth mode, and the apparatus includes:

a first parameter acquisition module configured to acquire first-type radiation parameters on a first channel under respective test conditions when the terminal operates in the Wi-Fi 2.4G mode, wherein the test conditions include a channel polarization direction and a spatial position of a test point with respect to the terminal;

a second parameter acquisition module configured to acquire a second-type radiation parameter on a second channel under a first test condition when the terminal operates in the Bluetooth mode, wherein the first test condition is one of the respective test conditions;

a radiation parameter determination module configured to: according to the first-type radiation parameters on the first channel under the respective test conditions and the second-type radiation parameter on the second channel under the first test condition, determine second-type radiation parameters on the second channel under other test conditions when the terminal operates in the Bluetooth mode, wherein the other test conditions include remaining of the respective test conditions other than the first test condition; and a total parameter determination module configured to determine a total Bluetooth radiation performance parameter of the terminal according to the second-type radiation parameter on the second channel under the first test condition and the second-type radiation parameters on the second channel under the other test conditions.

In some embodiments, the channel polarization direction includes a horizontal polarization direction and a vertical polarization direction; and the spatial position of the test point with respect to the terminal includes an angle of the test point in a horizontal direction with respect to the terminal, and an angle of the test point in a vertical direction with respect to the terminal.

In some embodiments, before the second parameter acquisition module acquires a second-type radiation parameter on a second channel under a first test condition, the apparatus further includes:

a target parameter determination sub-module configured to determine a target parameter from the first-type radiation parameters on the first channel under the respective test conditions; and a test condition determination sub-module configured to acquire a test condition corresponding to the target parameter as the first test condition.

In some embodiments, the target parameter determination sub-module is configured to:

determine the maximum value in the first-type radiation parameters on the first channel under the respective test conditions as the target parameter.

In some embodiments, the radiation parameter determination module includes:

a parameter ratio determination sub-module configured to determine a parameter ratio of a first-type radiation parameter on the first channel under the first test condition to the second-type radiation parameter on the second channel under the first test condition; and a parameter determination sub-module configured to determine the second-type radiation parameters on the first channel under the other test conditions according to the parameter ratio and the first-type radiation parameters on the first channel under the other test conditions.

In some embodiments, the first-type radiation parameters and the second-type radiation parameters are effective isotropic radiated power (EIRP); and the total Bluetooth radiation performance parameter is Bluetooth total radiated power (TRP);

or the first-type radiation parameters and the second-type radiation parameters are effective isotropic sensitivity (EIS); and the total Bluetooth radiation performance parameter is Bluetooth total isotropic sensitivity (TIS).

In some embodiments, a test environment for the first-type radiation parameters on the first channel under the respective test conditions is same as a test environment for the second-type radiation parameter on the second channel under the first test condition.

In some embodiments, a difference value between frequencies corresponding to the first channel and the second channel respectively is less than a specified difference value.

In some embodiments, the first channel is channel 1 in the Wi-Fi 2.4G mode and the second channel is channel 0 in the Bluetooth mode;

or the first channel is channel 6 in the Wi-Fi 2.4G mode or channel 7 in the Wi-Fi 2.4G mode, and the second channel is channel 39 in the Bluetooth mode;

or the first channel is channel 11 in the Wi-Fi 2.4G mode or channel 13 in the Wi-Fi 2.4G mode, and the second channel is channel 78 in the Bluetooth mode.

At least one embodiment of the present disclosure provides an apparatus for testing Bluetooth radiation performance of a terminal, wherein an antenna circuit used when the terminal operates in a wireless fidelity (Wi-Fi) 2.4G mode is same as an antenna circuit used when the terminal operates in a Bluetooth mode, and the apparatus includes:

a processor; and a memory for storing a processor-executable instruction, wherein the processor is configured to:

when the terminal operates in the Wi-Fi 2.4G mode, acquire first-type radiation parameters on a first channel under respective test conditions, wherein the respective test conditions include a channel polarization direction and a spatial position of a test point with respect to the terminal;

when the terminal operates in the Bluetooth mode, acquire a second-type radiation parameter on a second channel under a first test condition, wherein the first test condition is one of the respective test conditions;

according to the first-type radiation parameters on the first channel under the various test conditions and the second-type radiation parameter on the second channel under the first test condition, determine second-type radiation parameters on the second channel under other test conditions when the terminal operates in the Bluetooth mode, wherein the other test conditions include remaining of the respective test conditions other than the first test condition; and according to the second-type radiation parameter on the second channel under the first test condition and the second-type radiation parameters on the second channel under the other test conditions, determine a total Bluetooth radiation performance parameter of the terminal.

At least one embodiment of the present disclosure provides a non-transitory computer-readable storage medium, including an executable instruction which is invoked and executed by a processor to implement the method for testing Bluetooth radiation performance of a terminal, when the executable instruction is executed by the processor, the processor is configured to:

when the terminal operates in the Wi-Fi 2.4G mode, acquire first-type radiation parameters on a first channel under respective test conditions, wherein the respective test conditions include a channel polarization direction and a spatial position of a test point with respect to the terminal;

when the terminal operates in the Bluetooth mode, acquire a second-type radiation parameter on a second channel under a first test condition, wherein the first test condition is one of the respective test conditions;

according to the first-type radiation parameters on the first channel under the various test conditions and the second-type radiation parameter on the second channel under the first test condition, determine second-type radiation parameters on the second channel under other test conditions when the terminal operates in the Bluetooth mode, wherein the other test conditions include remaining of the respective test conditions other than the first test condition; and according to the second-type radiation parameter on the second channel under the first test condition and the second-type radiation parameters on the second channel under the other test conditions, determine a total Bluetooth radiation performance parameter of the terminal.

It is to be understood that both the foregoing general description and the following detailed description are exemplary and explanatory only and are not intended to limit the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of devices and methods consistent with aspects related to the disclosure as recited in the appended claims.

It is to be understood that the term "plurality" herein refers to two or more. "And/or" herein describes the correspondence of the corresponding objects, indicating three kinds of relationship. For example, A and/or B, can be expressed as: A exists alone, A and B exist concurrently, B exists alone. The character "/" generally indicates that the context object has a relationship of "OR".

Due to relatively lower Bluetooth power, it tends to be disconnected when the EIRP value and the EIS value at each angle are tested. As a result, the interruption of test occurs easily due to disconnection, thereby affecting the test time and hampering the progress in research and development.

Various embodiments of the present disclosure provide such a solution that all second-type radiation parameters under other test conditions can be acquired by test a second-type radiation parameter of the Bluetooth under a first test condition, and thus a total Bluetooth radiation performance parameter of the terminal is acquired. In one possible implementation, this solution can be based on the situation that an antenna circuit used when the terminal operates in a wireless fidelity (Wi-Fi) 2.4G mode is same as an antenna circuit used when the terminal operates in a Bluetooth mode.

Figure 1:
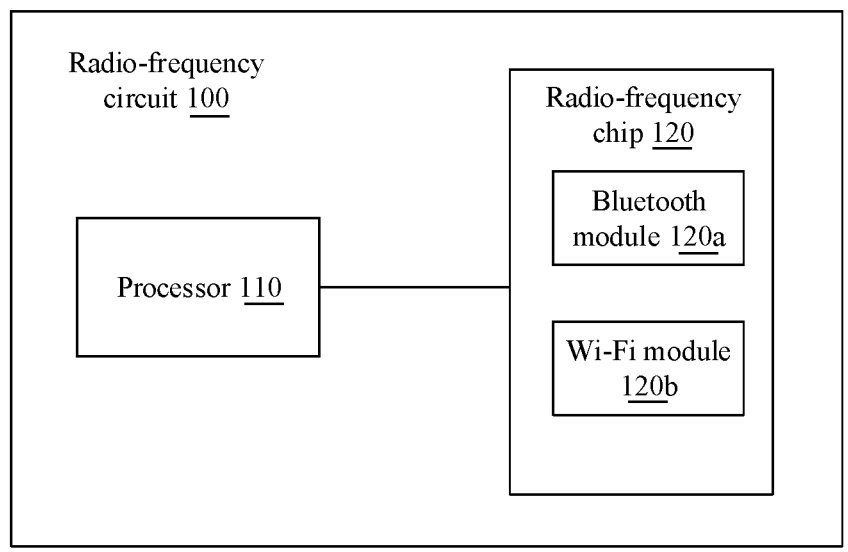
FIG. 1 is a structural diagram of a radio-frequency circuit of a terminal illustrated according to one exemplary embodiment.

FIG. 1 is a structural diagram of a radio-frequency circuit of a terminal illustrated according to one exemplary embodiment. The terminal may be a terminal such as a smart phone, a tablet computer and an e-book reader. A Wi-Fi module and a Bluetooth module in the terminal are integrated on the same radio-frequency chip and share a set of radio-frequency circuits. As illustrated in FIG. 1, the radio-frequency circuit 100 comprises a processor 110 and a radio-frequency chip 120. The radio-frequency chip 120 is connected to the processor 110 through a circuit.

As illustrated in FIG. 1, the radio-frequency chip 120 comprises a Bluetooth module 120a and a Wi-Fi module 120b, the Bluetooth module 120a supports a Bluetooth communication function and the Wi-Fi module 120b supports a Wi-Fi communication function.

The various circuits, device components, modules, units, blocks, or portions may have modular configurations, or are composed of discrete components, but nonetheless can be referred to as "units," "modules," or "portions" in general. In other words, the "circuits," "components," "modules," "blocks," "portions," or "units" referred to herein may or may not be in modular forms.

Figure 2:
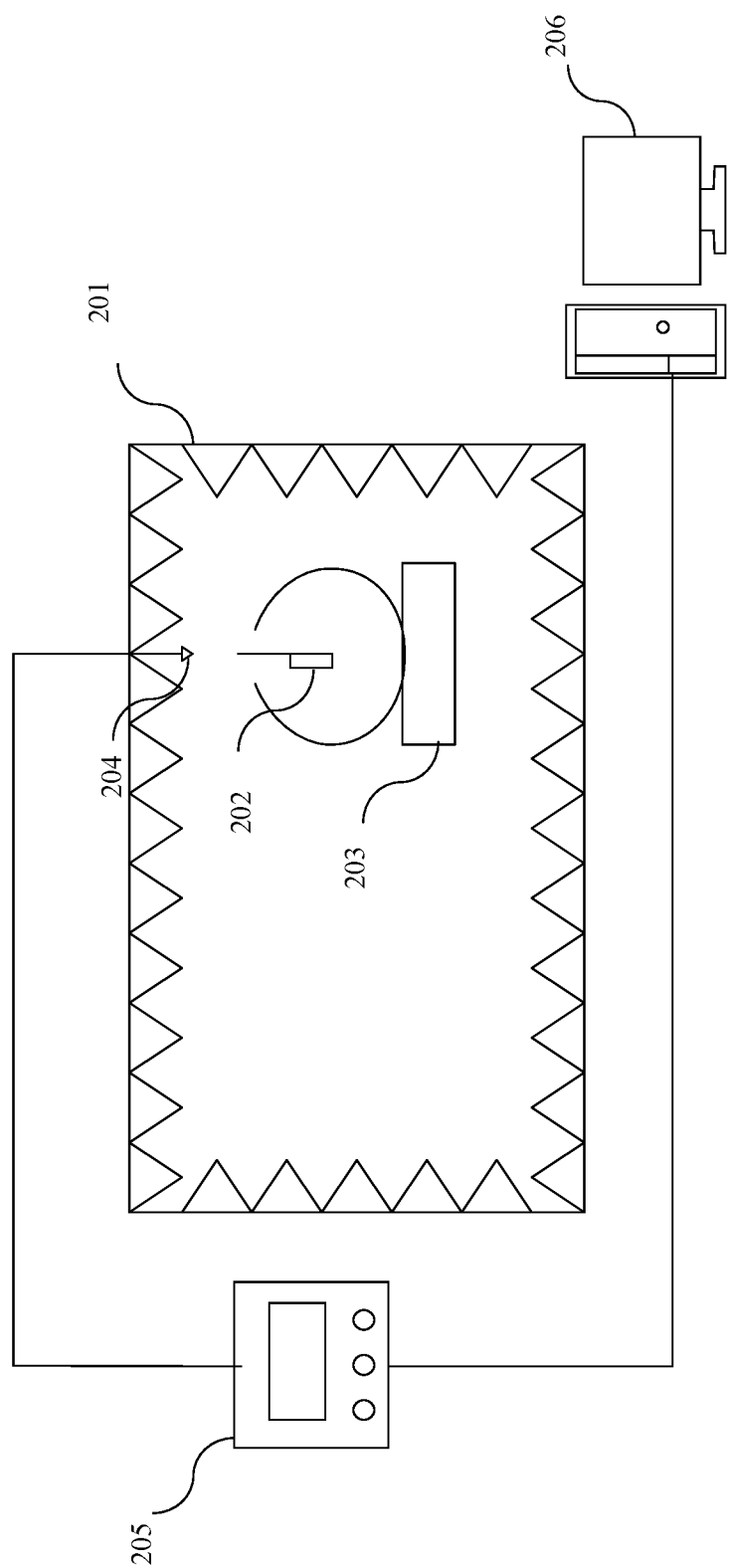
FIG. 2 is a structural diagram of a radiation performance testing system of a terminal illustrated according to one exemplary embodiment.

FIG. 2 is a structural diagram of a radiation performance testing system of a terminal illustrated according to one exemplary embodiment. The test system comprises an over the air (OTA) chamber 201, a terminal under test 202, a rotating table 203, a dual-polarized testing antenna 204, an integrated tester 205 and a computer device 206.

The terminal under test 202 is placed on the rotating table 203, and the rotating table 203 may implement the rotation of the terminal under test 202 at a vertical angle and a horizontal angle. The terminal under test 202 passes through various angles by rotating and at various angles, the terminal under test 202 is measured in a vertical polarization direction and a horizontal polarization direction via the dual-polarized testing antenna 204. Radiation parameters of the terminal under test 202 at each angle in the vertical polarization direction and the horizontal polarization direction are measured by the integrated tester 205, and the obtained radiation parameters are transferred to the computer device 206, and the radiation parameters are processed by the computer device 206 according to a specified program.

The dual-polarized antenna is a novel antenna that incorporates two antennas with orthogonal polarization directions of +45° and −45° and operates in a transceiving duplex-mode.

For example, when the terminal under test 202 operates in the Wi-Fi mode or the Bluetooth mode, the radiation parameters of the terminal are tested when the rotating table is at various angles with respect to the terminal in the horizontal direction and the vertical direction. For example, when the radiation parameters are tested, the test starts when the rotating table 203 is at an angle of 0° in the horizontal direction, and one round of rotation test in the vertical direction is performed at a plurality of horizontal angles; in each round of test, the test is performed once when the rotating table is rotated by the vertical angle of 45° every time from 0° until the rotating table is rotated to 180°, and then the next round of test at horizontal angles is performed. One round of test is performed at an angle interval of 45° from 0° and the test is not stopped until the rotating table is rotated to 360°. For example, when the rotating table 203 is at the horizontal angle of 45° with respect to the terminal under test 202, the radiation parameters are tested when the rotating table is at the vertical angles of 45°, 90° and 135° with respect to the terminal respectively; the radiation parameters of the terminal in the horizontal polarization direction and the vertical polarization direction are obtained; then when the rotating table 203 is at the horizontal angle of 90° with respect to the terminal under test 202, the radiation parameters are tested when the rotating table is at the vertical angles of 45°, 90° and 135° with respect to the terminal respectively; and similarly, the test process will continue until the rotating table 203 is at the horizontal angle of 360° with respect to the terminal under test 202, the radiation parameters are tested when the rotating table is at the vertical angles of 45°, 90° and 135° with respect to the terminal.

Figure 3:
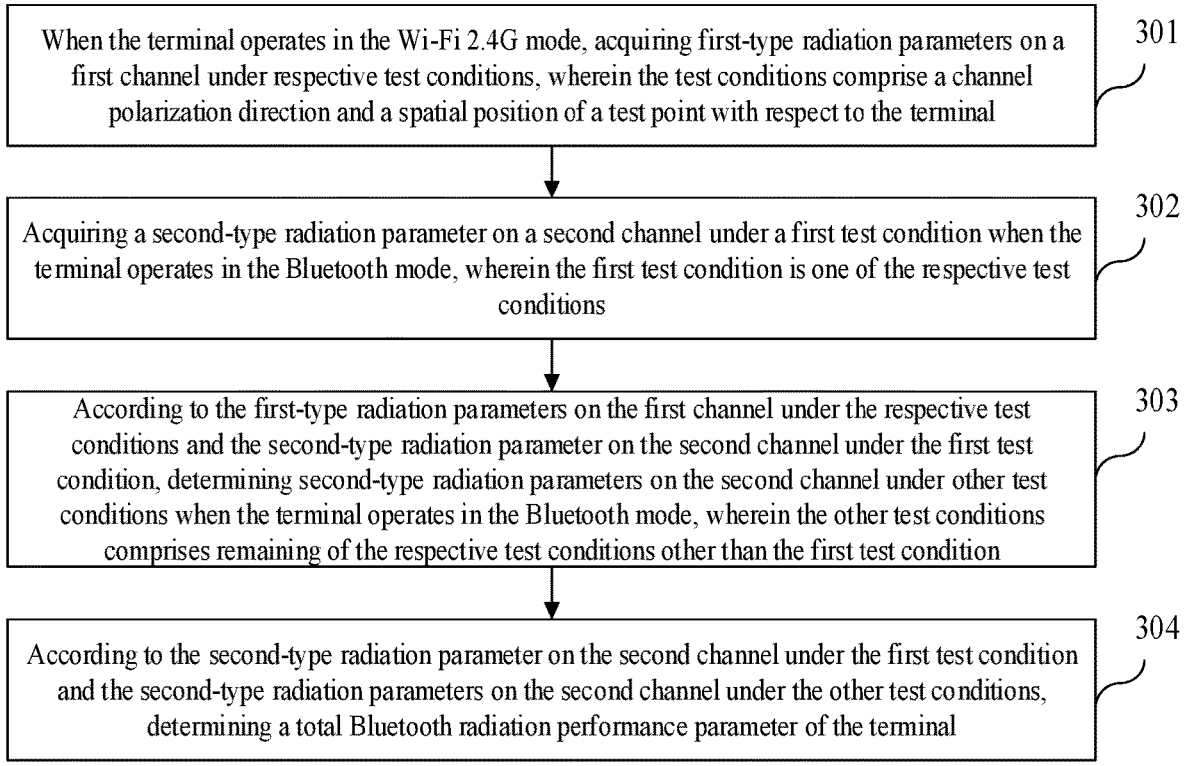
FIG. 3 is a flow chart of a method for testing Bluetooth radiation performance of a terminal illustrated according to one exemplary embodiment.

FIG. 3 is a flow chart of a method for testing Bluetooth radiation performance of a terminal shown according to one exemplary embodiment. This method for testing the Bluetooth radiation performance can be applicable to a computer device so as to test the Bluetooth radiation performance of the terminal. An antenna circuit used when the terminal operates in a wireless fidelity (Wi-Fi) 2.4G mode is same as an antenna circuit used when the terminal operates in a Bluetooth mode. For example, the terminal may be the terminal under test 202 illustrated in FIG. 2 and the computer device may be the computer device 206 illustrated in FIG. 2. As illustrated in FIG. 3, the method for testing the Bluetooth radiation performance may comprise the following steps.

In step 301, when the terminal operates in the Wi-Fi 2.4G mode, first-type radiation parameters on a first channel under respective test conditions are acquired, wherein the test conditions comprise a channel polarization direction and a spatial position of a test point with respect to the terminal.

In step 302, a second-type radiation parameter on a second channel under a first test condition is acquired when the terminal operates in the Bluetooth mode, wherein the first test condition is one of the respective test conditions.

In step 303, according to the first-type radiation parameters on the first channel under the respective test conditions and the second-type radiation parameter on the second channel under the first test condition, second-type radiation parameters on the second channel under other test conditions are determined when the terminal operates in the Bluetooth mode, wherein the other test conditions comprises remaining of the respective test conditions other than the first test condition.

In step 304, according to the second-type radiation parameter on the second channel under the first test condition and the second-type radiation parameters on the second channel under the other test conditions, a total Bluetooth radiation performance parameter of the terminal is determined.

In some embodiments, the channel polarization direction comprises a horizontal polarization direction and a vertical polarization direction; and the spatial position of the test point with respect to the terminal comprises an angle of the test point in a horizontal direction with respect to the terminal, and an angle of the test point in a vertical direction with respect to the terminal.

In some embodiments, the method further comprises the following steps before the step that a second-type radiation parameter on a second channel under a first test condition is acquired when the terminal operates in the Bluetooth mode:

a target parameter is determined from the first-type radiation parameters on the first channel under the respective test conditions; and a test condition corresponding to the target parameter is acquired as the first test condition.

In some embodiments, the step that a target parameter is determined from the first-type radiation parameters on the first channel under the respective test conditions comprises:

the maximum value in the first-type radiation parameters on the first channel under the respective test conditions is determined as the target parameter.

In some embodiments, the step that according to the first-type radiation parameters on the first channel under the respective test conditions and the second-type radiation parameter on the second channel under the first test condition, second-type radiation parameters on the second channel under other test conditions are tested when the terminal operates in the Bluetooth mode comprises:

a parameter ratio of a first-type radiation parameter on the first channel under the first test condition to the second-type radiation parameter on the second channel under the first test condition is determined; and the second-type radiation parameters on the first channel under the other test conditions are determined according to the parameter ratio and the first-type radiation parameters on the first channel under the other test conditions.

In some embodiments, the first-type radiation parameters and the second-type radiation parameters are effective isotropic radiated power (EIRP); and the total Bluetooth radiation performance parameter is Bluetooth total radiated power (TRP);

or the first-type radiation parameters and the second-type radiation parameters are effective isotropic sensitivity (EIS); and the total Bluetooth radiation performance parameter is Bluetooth total isotropic sensitivity (TIS).

In some embodiments, a test environment for the first-type radiation parameters on the first channel under the respective test conditions is same as a test environment for the second-type radiation parameter on the second channel under the first test condition.

In some embodiments, a difference value between frequencies corresponding to the first channel and the second channel respectively is less than a specified difference value.

In some embodiments, the first channel is channel 1 in the Wi-Fi 2.4G mode and the second channel is channel 0 in the Bluetooth mode;

or the first channel is channel 6 in the Wi-Fi 2.4G mode or channel 7 in the Wi-Fi 2.4G mode, and the second channel is channel 39 in the Bluetooth mode;

or the first channel is channel 11 in the Wi-Fi 2.4G mode or channel 13 in the Wi-Fi 2.4G mode, and the second channel is channel 78 in the Bluetooth mode.

In summary, in the method for testing the Bluetooth radiation performance provided in the embodiment of the present disclosure, when the terminal operates in the Wi-Fi 2.4G mode, the first-type radiation parameters on the first channel under respective test conditions are acquired; the second-type radiation parameter on the second channel under the first test condition is acquired; according to the first-type radiation parameters on the first channel under the respective test conditions and the second-type radiation parameter on the second channel under the first test condition, the second-type radiation parameters on the second channel under other test conditions are determined when the terminal operates in the Bluetooth mode; and according to the second-type radiation parameter on the second channel under the first test condition and the second-type radiation parameters on the second channel under the other test conditions, the total Bluetooth radiation performance parameter of the terminal is determined. Through the above solution, under the circumstance that the Wi-Fi radiation parameters of the terminal under respective test conditions are obtained by test, all that is needed is to test a Bluetooth radiation parameter of the terminal under all test condition when the terminal is in a Bluetooth operation mode, and all Bluetooth radiation parameters under other respective test conditions may be obtained through calculation. Thus, the situation that the test time is affected due to Bluetooth disconnection is avoided and the test efficiency of the Bluetooth radiation performance is improved.

Figure 4:
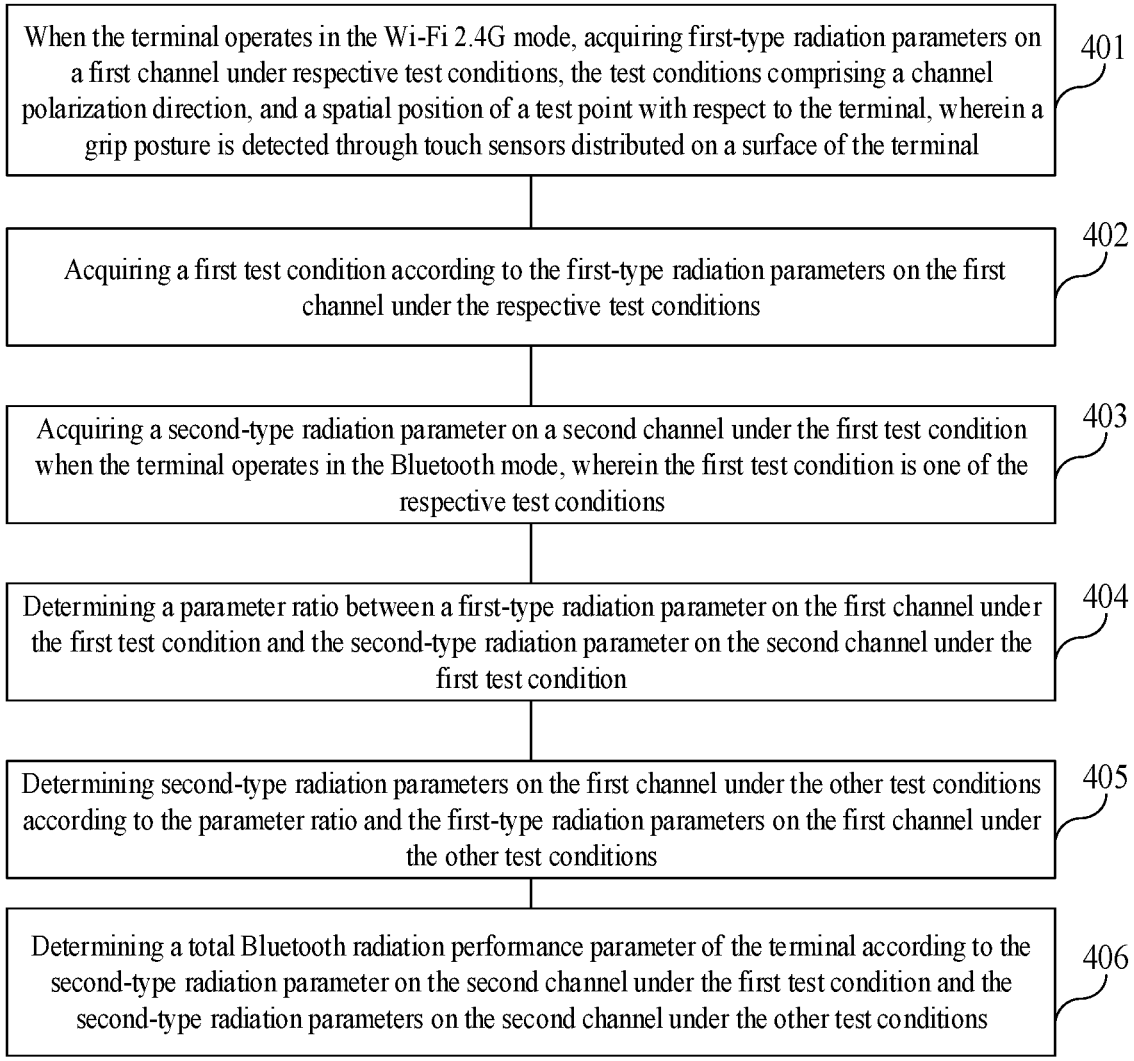
FIG. 4 is a flow chart of a method for testing Bluetooth radiation performance of a terminal illustrated according to another exemplary embodiment.

FIG. 4 is a flow chart of a method for testing Bluetooth radiation performance illustrated according to another exemplary embodiment. This method for testing the Bluetooth radiation performance can be applicable to a computer device so as to test the Bluetooth radiation performance of the terminal. An antenna circuit used when the terminal operates in a wireless fidelity (Wi-Fi) 2.4G mode is same as an antenna circuit used when the terminal operates in a Bluetooth mode. For example, the terminal can be the terminal under test 202 illustrated in FIG. 2 and the computer device can be the computer device 206 illustrated in FIG. 2. As illustrated in FIG. 4, the method for testing Bluetooth radiation performance may comprise the following steps.

In step 401, when the terminal operates in the Wi-Fi 2.4G mode, first-type radiation parameters on a first channel under respective test conditions are acquired.

The test conditions comprise a channel polarization direction and a spatial position of a test point with respect to the terminal.

In the embodiment of the present disclosure, the spatial position of the test point with respect to the terminal may comprise angles of the test point in a horizontal direction and a vertical direction with respect to the terminal, i.e., the angles by which the rotating table 203 is rotated in the horizontal direction and the vertical direction respectively in FIG. 2 above.

In some embodiments, the above antenna circuit can comprise an antenna, an antenna chip and a circuit between the antenna and the antenna chip.

In the embodiment of the present disclosure, when operating in the Wi-Fi 2.4G mode, the terminal is placed in a fixed suitable test environment, i.e., a fixed suitable OTA chamber, and the suitable OTA chamber may provide a silent radio-frequency environment. An integrated tester with Wi-Fi and Bluetooth signaling test functions tests the first-type radiation parameters on the first channel under respective test conditions. Test results obtained through the test by the tester are sent to the computer device connected to the tester through data transmission, and the computer device lists all acquired data through a display screen.

The first channel is a channel in the Wi-Fi 2.4G mode selected by the tester for testing when the terminal operates in the Wi-Fi 2.4G mode. According to the channel selection rules in the Wi-Fi 2.4G mode made by the Cellular Telecommunications Industry Association (CTIA), channel 1 in the Wi-Fi 2.4G mode and channel 6 in the Wi-Fi 2.4G mode, or channel 7 in the Wi-Fi 2.4G mode and channel 11 in the Wi-Fi 2.4G mode, or channel 13 in the Wi-Fi 2.4G mode should be tested in the Wi-Fi 2.4G mode.

For example, when the terminal operates in the Wi-Fi 2.4G mode, the integrated tester with Wi-Fi and Bluetooth signaling test functions can test first-type radiation parameters of the terminal in a horizontal polarization direction and a vertical polarization direction at respective test points.

The channel polarization direction comprises the horizontal polarization direction and the vertical polarization direction; the spatial position of the test point with respect to the terminal comprises an angle of the test point in a horizontal direction with respect to the terminal, and an angle of the test point in a vertical direction with respect to the terminal.

The angle of the test point in the horizontal direction with respect to the terminal may be set as a horizontal angle $\varphi$ in the range of $0°\leq\varphi\leq360°$ and the angle interval may be 45°. The angle of the test point in the vertical direction with respect to the terminal may be set as a vertical angle $\theta$ in the range of $0°\leq\theta\leq180°$ and the angle interval may be 45°.

The first-type radiation parameters may be effective isotropic radiated power or effective isotropic sensitivity.

For example, when the terminal operates in the Wi-Fi 2.4G mode, the integrated tester with the Wi-Fi and Bluetooth signaling test functions, in the OTA chamber, tests effective isotropic radiated power of the terminal on channel 1 in the Wi-Fi 2.4G mode, that is, tests the first-type radiation parameters of the terminal at respective angles in the horizontal polarization direction and the vertical polarization direction respectively. The horizontal angle $\varphi$ of the test point is in the range of $0°\leq\varphi\leq360°$ and the angle interval is 45°; and the vertical angle $\theta$ of the test point is in the range of $0°\leq\theta\leq180°$ and the angle interval is 45°. The computer device acquires test results obtained through the test by the tester.

For example, the test results obtained by the computer device may be as shown in tables 1 and 2, wherein Table 1 shows the test results at various test points in the horizontal polarization direction and Table 2 shows the test results at various test points in the vertical polarization direction.

TABLE 1

| Horizontal polarization | 0° | 45° | 90° | 135° | 180° | 225° | 270° | 315° | Horizontal angle |
|---|---|---|---|---|---|---|---|---|---|
| 45° | −21.6 | −21.9 | −21.1 | −22.2 | −21.8 | −21.1 | −20.8 | −21.1 | |
| 90° | −17.7 | −17.7 | −17.7 | −17.7 | −17.9 | −18 | −18 | −18 | |
| 135° | −20.7 | −19.9 | −19.5 | −19.8 | −20.6 | −21.2 | −21.2 | −21 | |
| Vertical angle | | | | | | | | | |

TABLE 2

| Vertical polarization | 0° | 45° | 90° | 135° | 180° | 225° | 270° | 315° | Horizontal angle |
|---|---|---|---|---|---|---|---|---|---|
| 45° | −34.04 | −34.4 | −39.3 | −42.2 | −38.1 | −39.7 | −46.4 | −39.2 | |
| 90° | −33.4 | −34.1 | −39.3 | −46 | −40.7 | −41.4 | −43.6 | −37.2 | |
| 135° | −30.9 | −31.2 | −34.2 | −38.8 | −40 | −40.2 | −38 | −34.1 | |
| Vertical angle | | | | | | | | | |

In step 402, a first test condition is acquired according to the first-type radiation parameters on the first channel under the respective test conditions.

In the embodiment of the present disclosure, a target parameter can be determined from the first-type radiation parameters on the first channel under the respective test conditions; and a test condition corresponding to the target parameter is acquired as the first test condition.

The way in which the target parameter is determined from the first-type radiation parameters on the first channel under the respective test conditions and the test condition corresponding to the target parameter is acquired as the first test condition may comprise, but is not limited to the following ways.

1) The first-type radiation parameter with the maximum value in the first-type radiation parameters on the first channel under the respective test conditions is determined as the target parameter.

For example, as shown in Table 1 and Table 2, it can be seen that in the horizontal polarization direction, when the horizontal angle φ is 135° and the vertical angle θ is 90°, the effective radiated power is maximum and the maximum parameter value is −17.7 dBm. At this time, the computer device can determine, in the horizontal polarization direction, the effective radiated power of the test point with the horizontal angle of 135° and the vertical angle of 90° as the target parameter.

2) The first-type radiation parameter with the minimum value in the first-type radiation parameters on the first channel under the respective test conditions is determined as the target parameter.

For example, as shown in Table 1 and Table 2, it can be seen that in the vertical polarization direction, when the horizontal angle φ is 270° and the vertical angle θ is 45°, the effective radiated power is minimum and the minimum parameter value is −46.4 dBm. At this time, the computer device can determine, in the vertical polarization direction, the effective radiated power of the test point with the horizontal angle of 270° and the vertical angle of 45° as the target parameter.

3) The first-type radiation parameter with the intermediate value in the first-type radiation parameters on the first channel under the respective test conditions is determined as the target parameter.

For example, as shown in Table 1 and Table 2, it can be seen that in the vertical polarization direction, when the horizontal angle φ is 0° and the vertical angle θ is 135°, the effective radiated power is intermediate and the intermediate parameter value is −30.9 dBm. At this time, the computer device can determine, in the vertical polarization direction, the effective radiated power of the test point with the horizontal angle of 0° and the vertical angle of 135° as the target parameter.

4) The first-type radiation parameter randomly selected from the first-type radiation parameters on the first channel under the respective test conditions is determined as the target parameter.

For example, as illustrated in Table 1 and Table 2, the value of the target parameter may the parameter value of any test point.

In step 403, a second-type radiation parameter on a second channel under the first test condition is acquired when the terminal operates in the Bluetooth mode, wherein the first test condition is one of the respective test conditions.

In the embodiment of the present disclosure, the computer device feeds back the first test condition corresponding to the target parameter to the tester according to the selected target parameter. The tester tests the radiation parameter under the first test condition when the terminal operates in the Bluetooth mode. The computer device acquires the radiation parameter as the second-type radiation parameter and the second-type radiation parameter is the Bluetooth radiation parameter of the terminal.

It should be noted that a test environment for the second-type radiation parameter above is same as a test environment for the first-type radiation parameters above. For example, the tester tests the two types of radiation parameters of the same terminal with one OTA chamber.

In the embodiment of the present disclosure, the testing for the Bluetooth radiation performance may be the testing for channel 0 in the Bluetooth mode, channel 39 in the Bluetooth mode and channel 78 in the Bluetooth mode, respectively.

In some embodiments, in order to reduce a test error, a difference value between frequencies corresponding to the first channel and the second channel is less than a specified difference value.

For example, in the Wi-Fi 2.4G mode, there are 14 channels and the operating frequency range is 2.4 GHz-2.4835 GHz. In the Bluetooth mode, there are 79 channels, the operating frequency range is 2.402 GHz to 2480 GHz, and the bandwidth of each channel is 1 MHz. In order to enable the difference value between frequencies corresponding to the first channel and the second channel to be less than the specified difference value, when the first channel is channel 1 in the Wi-Fi 2.4G mode, the second channel may be channel 0 in the Bluetooth mode; when the first channel is channel 6 in the Wi-Fi 2.4G mode or channel 7 in the Wi-Fi 2.4G mode, the second channel may be channel 39 in the Bluetooth mode; and when the first channel is channel 11 in the Wi-Fi 2.4G mode or channel 13 in the Wi-Fi 2.4G mode, the second channel may be channel 78 in the Bluetooth mode.

For example, as shown in Table 1 and Table 2, when the first-type radiation parameter with the maximum value in the first-type radiation parameters on the first channel under the respective test conditions is determined as the target parameter, in the horizontal polarization direction, the effective radiated power is maximum when the horizontal angle φ is 135° and the vertical angle θ is 90°, and the maximum parameter value is −17.7 dBm. The computer device determines the effective radiated power of this test point as the target parameter and feeds back the test condition (in the horizontal polarization direction, the horizontal angle φ is 135° and the vertical angle θ is 90°) of the target parameter to the tester. The tester measures that the effective radiated power of the terminal on channel 0 in the Bluetooth mode under this test condition is −26.7 dBm, and the computer device acquires the effective radiated power of −26.7 dBm as the second-type radiation parameter.

In step 404, a parameter ratio between a first-type radiation parameter on the first channel under the first test condition and the second-type radiation parameter on the second channel under the first test condition is determined.

In the embodiment of the present disclosure, the computer device can acquire the first-type radiation parameter and the second-type radiation parameter, and calculate the ratio between the first-type radiation parameter and the second-type radiation parameter to obtain a parameter ratio.

The parameter ratio can be calculated by dividing the first-type radiation parameter by the second-type radiation parameter and can further be calculated by dividing the second-type radiation parameter by the first-type radiation parameter.

For example, as shown in Table 1 and 2, when the second-type radiation parameter and the first-type radiation parameter which are acquired by the computer device are −26.7 dBm and −17.7 dBm respectively, the ratio between the first-type radiation parameter and the second-type radiation parameter is calculated. When the ratio of the first-type radiation parameter to the second-type radiation parameter is calculated, the calculated result is about 0.66; and when the ratio of the second-type radiation parameter to the first-type radiation parameter is calculated, the calculated result is about 1.5.

In step 405, second-type radiation parameters on the first channel under the other test conditions are determined according to the parameter ratio and the first-type radiation parameters on the first channel under the other test conditions.

In the embodiment of the present disclosure, the parameter ratio between the first-type radiation parameter on the first channel under the first test condition and the second-type radiation parameter on the second channel under the first test condition can be acquired; and then according to the parameter ratio and the first-type radiation parameters on the first channel under the other test conditions, the second-type radiation parameters on the first channel under the other test conditions are calculated.

For example, when the first-type radiation parameter with the maximum value is determined as the target parameter, as shown in Table 1 and Table 2, it is determined that in the horizontal polarization direction, when the horizontal angle φ is 135° and the vertical angle θ is 90°, the effective radiated power is maximum and the target parameter value is −17.7 dBm. When the Bluetooth channel 0 is measured, in the horizontal polarization direction, the effective radiated power of the test point is −26.7 dBm when the horizontal angle φ is 135° and the vertical angle θ is 90°. When the ratio of the second-type radiation parameter to the first-type radiation parameter is calculated, it can be seen that the parameter ratio is 1.5. By multiplying the parameter ratio by the effective radiated power of each test point in Table 1 and Table 2, the effective radiated power of the corresponding test point in the corresponding polarization direction can be obtained when Bluetooth channel 0 is measured. Through the data in Table 1 and Table 2, the effective radiated power value of each test point in the vertical polarization direction and the horizontal polarization direction of the Bluetooth channel 0 may be specifically calculated. The details are shown in Table 3 and Table 4 below.

TABLE 3

| Horizontal polarization | 0° | 45° | 90° | 135° | 180° | 225° | 270° | 315° | Horizontal angle |
|---|---|---|---|---|---|---|---|---|---|
| 45° | −32.4 | −32.85 | −31.65 | −33.3 | −32.7 | −31.65 | −31.2 | −31.65 | |
| 90° | −26.7 | −26.7 | −26.7 | −26.7 | −26.85 | −27 | −27 | −27 | |
| 135° | −31.05 | −29.85 | −29.25 | −29.7 | −30.9 | −31.8 | −31.8 | −31.5 | |
| Vertical angle | | | | | | | | | |

TABLE 4

| Vertical polarization | 0° | 45° | 90° | 135° | 180° | 225° | 270° | 315° | Horizontal angle |
|---|---|---|---|---|---|---|---|---|---|
| 45° | −51.06 | −51.6 | −58.95 | −63.3 | −57.15 | −59.55 | −69.6 | −58.8 | |
| 90° | −50.1 | −51.15 | −58.95 | −69 | −61.05 | −62.1 | −65.4 | −55.8 | |
| 135° | −46.35 | −46.8 | −51.3 | −58.2 | −60 | −60.3 | −57 | −51.15 | |
| Vertical angle | | | | | | | | | |

In step 406, according to the second-type radiation parameter on the second channel under the first test condition and the second-type radiation parameters on the second channel under the other test conditions, a total Bluetooth radiation performance parameter of the terminal is determined.

In the embodiment of the present disclosure, the computer device can obtain the total Bluetooth radiation performance parameter of the terminal through a calculation formula according to the acquired second-type radiation parameter on the second channel.

The total Bluetooth radiation performance parameter may comprise total radiant power and total isotropic sensitivity. The total radiated power (TRP) represents signal radiation performance of the Bluetooth and the total isotropic sensitivity (TIS) represents signal reception performance of the Bluetooth.

The formula for obtaining the total radiated power under the Bluetooth test channel by calculation of to the effective radiated power is as follows:

$$TRP = \frac{\pi}{2NM} \sum_{i=1}^{N1} \sum_{j=0}^{M1} [EIRP_\theta(\theta_i, \varphi_j) + EIRP_\varphi(\theta_i, \varphi_j)]\sin(\theta_i);$$

The formula for obtaining the total isotropic sensitivity under the Bluetooth test channel by calculation of the effective isotropic sensitivity is as follows:

$$TIS = \frac{2NM}{\pi \sum_{i=1}^{N-1} \sum_{j=0}^{M-1} \left[ \frac{1}{EIS_\theta(\theta_i, \varphi_j)} + \frac{1}{EIS_\varphi(\theta_i, \varphi_j)} \right] \sin(\theta_i)};$$

where $EIRP_\theta(\theta_i,\varphi_j)$ denotes the effective isotropic radiated power in the vertical polarization direction when the vertical angle is i and the horizontal angle is j; $EIRP_\varphi(\theta_i,\varphi_j)$ denotes the effective isotropic radiated power in the horizontal polarization direction when the vertical angle is i and the horizontal angle is j; $\theta_i$ denotes the vertical angle i; TRP denotes the total radiant power; $EIS_\theta(\theta_i,\varphi_j)$ denotes the effective isotropic sensitivity in the vertical polarization direction when the vertical angle is i and the horizontal angle is j; $EIS_\varphi(\theta_i,\varphi_j)$ denotes the effective isotropic sensitivity in the horizontal polarization direction when the vertical angle is i and the horizontal angle is j; TIS denotes the total isotropic sensitivity; N is the number of samples of the vertical angles; and M is the number of samples of the horizontal angles.

For example, when the acquired second-type radiation parameters under the second channel are as shown in Table 3 and Table 4, it can be seen from the above formula that: $EIRP_\theta(\theta_i,\varphi_j)+EIRP_\varphi(\theta_i,\varphi_j)$ refers to a value obtained by adding effective radiated power in the vertical polarization direction and the horizontal polarization direction at each test point with the same vertical angle and the horizontal angle. This value is the effective radiated power at this test point. The specific values of the effective radiated power are as shown in Table 5:

TABLE 5

|  | 0° | 45° | 90° | 135° | 180° | 225° | 270° | 315° | Horizontal angle |
|---|---|---|---|---|---|---|---|---|---|
| 45° | −83.46 | −84.45 | −90.6 | −96.6 | −89.85 | −91.2 | −100.8 | −90.45 | |
| 90° | −76.65 | −77.7 | −85.5 | −95.55 | −87.9 | −89.1 | −92.4 | −82.8 | |
| 135° | −77.4 | −76.65 | −80.55 | −87.9 | −90.9 | −92.1 | −88.8 | −82.65 | |
| Vertical angle | | | | | | | | | |

The number of the samples of the vertical angle is 3, and thus N is 3. The number of the samples of the horizontal angle is 8, and thus M is 8. It is known that the path loss of the test system is −35 dB, the TRP of the Bluetooth channel 0 can be obtained through calculation of the known data by the computer device, which is approximately equal to 7.57 dBm (rounded to two decimal places).

In summary, in the method for testing the Bluetooth radiation performance provided in the embodiment of the present disclosure, when the terminal operates in the Wi-Fi 2.4G mode, first-type radiation parameters on the first channel under respective test conditions are acquired, wherein the test conditions comprise the channel polarization direction and the spatial position of the test point with respect to the terminal; when the terminal operates in the Bluetooth mode, the second-type radiation parameter on the second channel under the first test condition is acquired, wherein the first test condition is one of the respective test conditions; according to the first-type radiation parameters on the first channel under the respective test conditions and the second-type radiation parameter on the second channel under the first test condition, second-type radiation parameters on the second channel under other test conditions are determined when the terminal operates in the Bluetooth mode, wherein the other test conditions comprise remaining of the respect test conditions other than the first test condition; and according to the second-type radiation parameter on the second channel under the first test condition and the second-type radiation parameters on the second channel under the other test conditions, the total Bluetooth radiation performance parameter of the terminal is determined. Through the above solution, under the circumstance that the Wi-Fi radiation parameters of the terminal under respective test conditions are obtained by test, all that is needed is to test a Bluetooth radiation parameter of the terminal under all test conditions when the terminal is in a Bluetooth operation mode, and all Bluetooth radiation parameters under remaining of the respective test conditions can be obtained through calculation. Thus, the situation that the test time is affected due to Bluetooth disconnection is avoided and the test efficiency of the Bluetooth radiation performance is improved.

Figure 5:
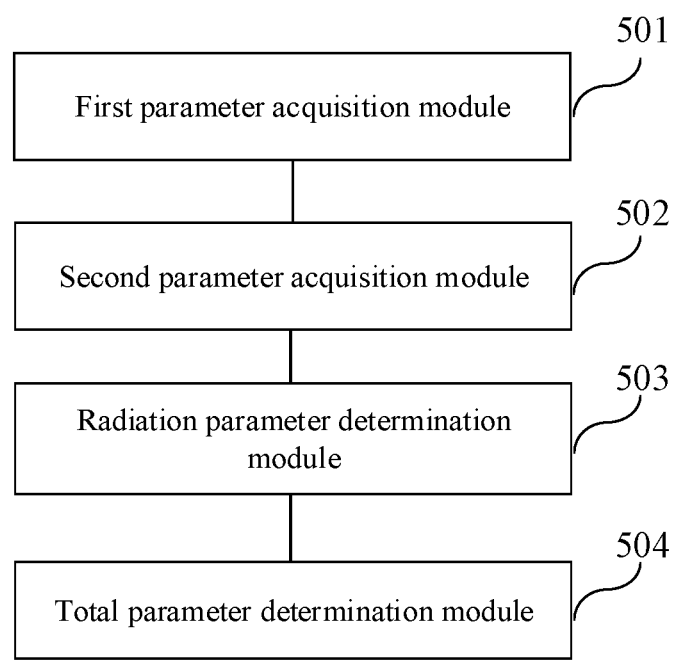
FIG. 5 is a block diagram of an apparatus for testing Bluetooth radiation performance of a terminal illustrated according to one exemplary embodiment.

FIG. 5 is a block diagram of an apparatus for testing Bluetooth radiation performance of a terminal illustrated according to one exemplary embodiment. As illustrated in FIG. 5, the apparatus for testing the Bluetooth radiation performance of the terminal may be implemented as all or part of the computer device through hardware or a combination of software and hardware so as to execute the steps in any embodiment illustrated in FIG. 3 or FIG. 4. An antenna circuit used when the terminal operates in a wireless fidelity (Wi-Fi) 2.4G mode is same as an antenna circuit used when the terminal operates in a Bluetooth mode. For example, the terminal can be the terminal under test 202 illustrated in FIG. 2 and the computer device can be the computer device 206 illustrated in FIG. 2. The apparatus for testing the Bluetooth radiation performance of the terminal can comprise:

a first parameter acquisition module 501 configured to acquire first-type radiation parameters on a first channel under respective test conditions when the terminal operates in the Wi-Fi 2.4G mode, wherein the test conditions comprise a channel polarization direction and a spatial position of a test point with respect to the terminal;

a second parameter acquisition module 502 configured to acquire a second-type radiation parameter on a second channel under a first test condition when the terminal operates in the Bluetooth mode, wherein the first test condition is one test condition among the respective test conditions;

a radiation parameter determination module 503 configured to: according to the first-type radiation parameters on the first channel under the respective test conditions and the second-type radiation parameter on the second channel under the first test condition, determine second-type radiation parameters on the second channel under other test conditions when the terminal operates in the Bluetooth mode, wherein the other test conditions comprises remaining of the respective test conditions other than the first test condition; and a total parameter determination module 504 configured to determine a total Bluetooth radiation performance parameter of the terminal according to the second-type radiation parameter on the second channel under the first test condition and the second-type radiation parameters on the second channel under the other test conditions.

In some embodiments, the channel polarization direction comprises a horizontal polarization direction and a vertical polarization direction; and the spatial position of the test point with respect to the terminal comprises an angle of the test point in a horizontal direction with respect to the terminal, and an angle of the test point in a vertical direction with respect to the terminal.

In some embodiments, before the second parameter acquisition module acquires a second-type radiation parameter on a second channel under a first test condition, the apparatus further comprises:

a target parameter determination sub-module configured to determine a target parameter from the first-type radiation parameters on the first channel under the respective test conditions; and a test condition determination sub-module configured to acquire a test condition corresponding to the target parameter as the first test condition.

In some embodiments, the target parameter determination sub-module is configured to:

determine the maximum value in the first-type radiation parameters on the first channel under the respective test conditions as the target parameter.

In some embodiments, the radiation parameter domination module comprises:

a parameter ratio determination sub-module configured to determine a parameter ratio of a first-type radiation parameter on the first channel under the first test condition to the second-type radiation parameter on the second channel under the first test condition; and a parameter determination sub-module configured to determine the second-type radiation parameters on the first channel under the other test conditions according to the parameter ratio and the first-type radiation parameters on the first channel under the other test conditions.

In some embodiments, the first-type radiation parameters and the second-type radiation parameters are effective isotropic radiated power (EIRP); and the total Bluetooth radiation performance parameter is total radiated power (TRP) of the Bluetooth;

or the first-type radiation parameters and the second-type radiation parameters are effective isotropic sensitivity (EIS); and the total Bluetooth radiation performance parameter is Bluetooth total isotropic sensitivity (TIS).

In some embodiments, a test environment for the first-type radiation parameter on the first channel under respective test conditions is same as a test environment for the second-type radiation parameter on the second channel under the first test condition.

In some embodiments, a difference value between frequencies corresponding to the first channel and the second channel is less than a specified difference value.

In some embodiments, the first channel is channel 1 in the Wi-Fi 2.4G mode and the second channel is channel 0 in the Bluetooth mode;

or the first channel is channel 6 in the Wi-Fi 2.4G mode or channel 7 in the Wi-Fi 2.4G mode, and the second channel is channel 39 in the Bluetooth mode;

or the first channel is channel 11 in the Wi-Fi 2.4G mode or channel 13 in the Wi-Fi 2.4G mode, and the second channel is channel 78 in the Bluetooth mode.

It should be noted that the apparatus provided in the above embodiment is only illustrated by the division of various functional modules when implementing its function. In practical application, the above functions may be assigned to different functional modules for complete according to actual requirements, that is, the content structure of the device is divided into different functional modules to achieve all or part of the functions described above.

For the device in the above embodiment, the specific mode of each module for executing operations has been described in detail in the embodiment of the related method and is not elaborated herein.

One exemplary embodiment of the present disclosure provides an apparatus for testing Bluetooth radiation performance of a terminal, and the apparatus for testing the Bluetooth radiation performance of the terminal may be implemented as all or part of the computer device through hardware or a combination of software and hardware and is capable of executing all or part of steps in any embodiment illustrated in FIG. 3 or FIG. 4. An antenna circuit used when the terminal operates in a wireless fidelity (Wi-Fi) 2.4G mode is same as an antenna circuit used when the terminal operates in a Bluetooth mode. For example, the terminal can be the terminal under test 202 illustrated in FIG. 2 and the computer device can be the computer device 206 illustrated in FIG. 2. The apparatus for testing the Bluetooth radiation performance of the terminal comprises: a processor, and a memory for storing a processor-executable instruction.

The processor is configured to:

when the terminal operates in the Wi-Fi 2.4G mode, acquire first-type radiation parameters on a first channel under respective test conditions, wherein the test conditions comprise a channel polarization direction and a spatial position of a test point with respect to the terminal;

when the terminal operates in the Bluetooth mode, acquire a second-type radiation parameter on a second channel under a first test condition, wherein the first test condition is one test condition in the respective test conditions;

according to the first-type radiation parameters on the first channel under the respective test conditions and the second-type radiation parameter on the second channel under the first test condition, determine second-type radiation parameters on the second channel under other test conditions when the terminal operates in the Bluetooth mode, wherein the other test conditions comprise remaining of the respective test conditions other than the first test condition; and according to the second-type radiation parameter on the second channel under the first test condition and the second-type radiation parameters on the second channel under the other test conditions, determine a total Bluetooth radiation performance parameter of the terminal.

In some embodiments, the channel polarization direction comprises a horizontal polarization direction and a vertical polarization direction; and the spatial position of the test point with respect to the terminal comprises an angle of the test point in a horizontal direction with respect to the terminal, and an angle of the test point in a vertical direction with respect to the terminal.

In some embodiments, the following are comprised before the step that a second-type radiation parameter on a second channel under a first test condition is acquired when the terminal operates in the Bluetooth mode:

a target parameter is determined from the first-type radiation parameters on the first channel under the respective test conditions; and a test condition corresponding to the target parameter is acquired as the first test condition.

In some embodiments, the step that a target parameter is determined from the first-type radiation parameters on the first channel under the respective test conditions comprises:

the maximum value in the first-type radiation parameters on the first channel under the respective test conditions is determined as the target parameter.

In some embodiments, the step that according to the first-type radiation parameters on the first channel under the respective test conditions and the second-type radiation parameter on the second channel under the first test condition, second-type radiation parameters on the second channel under other test conditions are tested when the terminal operates in the Bluetooth mode comprises:

a parameter ratio of a first-type radiation parameter on the first channel under the first test condition to the second-type radiation parameter on the second channel under the first test condition is determined; and the second-type radiation parameters on the first channel under the other test conditions are determined according to the parameter ratio and the first-type radiation parameters on the first channel under the other test conditions.

In some embodiments, the first-type radiation parameters and the second-type radiation parameters are effective isotropic radiated power (EIRP); and the total Bluetooth radiation performance parameter is Bluetooth total radiated power (TRP);

or the first-type radiation parameters and the second-type radiation parameters are effective isotropic sensitivity (EIS); and the total Bluetooth radiation performance parameter is Bluetooth total isotropic sensitivity (TIS).

In some embodiments, a test environment for the first-type radiation parameters on the first channel under respective test conditions is same as a test environment for the second-type radiation parameter on the second channel under the first test condition.

In some embodiments, a difference value between frequencies corresponding to the first channel and the second channel is less than a specified difference value.

In some embodiments, the first channel is channel 1 in the Wi-Fi 2.4G mode and the second channel is channel 0 in the Bluetooth mode;

or the first channel is channel 6 in the Wi-Fi 2.4G mode or channel 7 in the Wi-Fi 2.4G mode, and the second channel is channel 39 in the Bluetooth mode;

or the first channel is channel 11 in the Wi-Fi 2.4G mode or channel 13 in the Wi-Fi 2.4G mode, and the second channel is channel 78 in the Bluetooth mode.

Figure 6:
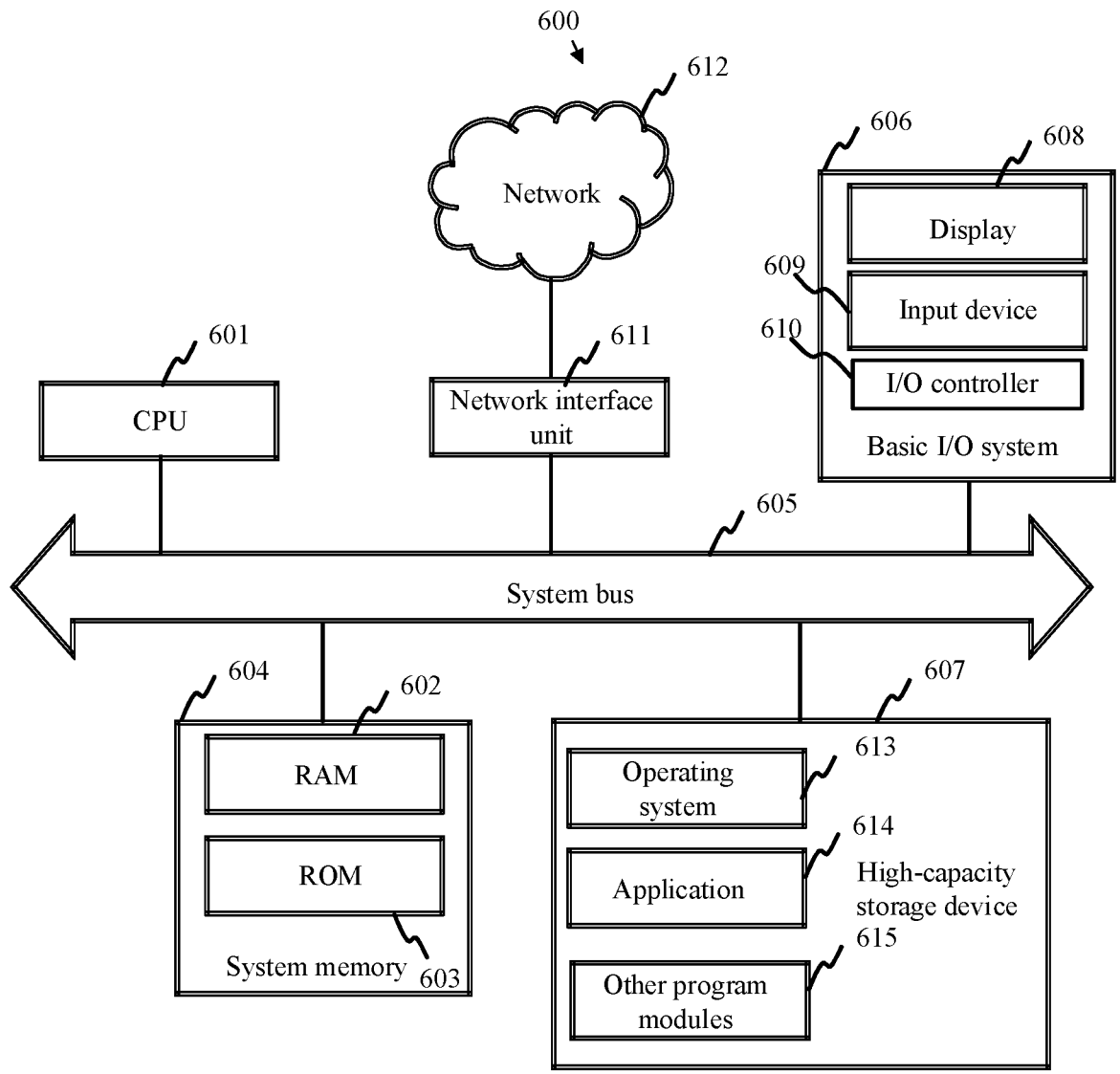
FIG. 6 is a structural diagram of a computing device illustrated according to one exemplary embodiment.

FIG. 6 is a structural diagram of a commuter device illustrated according to one exemplary embodiment. The computer device 600 comprises a central processing unit (CPU) 601, a system memory 604 comprising a random-access memory (RAM) 602 and a read-only memory (ROM) 603, and a system bus 605 connecting the system memory 604 and the central processing unit 601. The computer device 600 further comprises a basic input/output system (I/O system) 606 which helps transfer information between various components within the computer device, and a high-capacity storage device 607 for storing an operating system 613, an application 614 and other program modules 615.

The basic input/output system 606 comprises a display 608 for displaying information and an input device 609, such as a mouse and a keyboard, for inputting information by the user. Both the display 608 and the input device 609 are connected to the central processing unit 601 through an input/output controller 610 connected to the system bus 605. The basic input/output system 606 may also comprise the input/output controller 610 for receiving and processing input from a plurality of other devices, such as a keyboard, a mouse, or an electronic stylus. Similarly, the input/output controller 610 further provides output to a display screen, a printer or other types of output devices.

The high-capacity storage device 607 is connected to the central processing unit 601 through a high-capacity storage controller (not shown) connected to the system bus 605. The high-capacity storage device 607 and a non-transitory computer-readable medium associated therewith provide non-volatile storage for the computer device 600. That is, the high-capacity storage device 607 may comprise a non-transitory computer-readable medium (not shown), such as a hard disk or a CD-ROM driver.

Without loss of generality, the non-transitory computer-readable medium can comprise a computer device storage medium and a communication medium. The computer device storage medium comprises volatile and non-volatile, removable and non-removable media implemented in any method or technology for storage of information such as a non-transitory computer-readable instruction, a data structure, a program module or other data. The computer device storage medium comprises a RAM, an ROM, an EPROM, an EEPROM, a flash memory or other solid-state storage technologies, a CD-ROM, DVD or other optical storage, a tape cartridge, a magnetic tape, a disk storage or other magnetic storage devices. Of course, it will be known by a person skilled in the art that the computer device storage medium is not limited to above. The above system memory 604 and the high-capacity storage device 607 may be collectively referred to as the memory.

According to various embodiments of the present disclosure, the computer device 600 can further be connected to a remote computer on a network through the network, such as the Internet, for operation. That is, the computer device 600 may be connected to the network 612 through a network interface unit 611 connected to the system bus 605, or may be connected to other types of networks or remote computer device systems (not shown) through the network interface unit 611.

The memory further comprises one or more programs which are stored on the memory, and the central processing unit 601 implements all or part of steps of the method illustrated in FIG. 3 or FIG. 4 by executing the one or more programs.

Various embodiments of the present disclosure can have one or more of the following advantages.

When the terminal operates in the Wi-Fi 2.4G mode, the first-type radiation parameters on the first channel under the respective test conditions are acquired, wherein the test conditions comprise the channel polarization direction and the spatial position of the test point with respect to the terminal; when the terminal operates in the Bluetooth mode, the second-type radiation parameter on the second channel under the first test condition is acquired, wherein the first test condition is one of the respective test conditions; according to the first-type radiation parameters on the first channel under the respective test conditions and the second-type radiation parameter on the second channel under the first test condition, the second-type radiation parameters on the second channel under other test conditions are determined when the terminal operates in the Bluetooth mode, wherein the other test conditions comprises remaining of the respective test conditions other than the first test condition; and according to the second-type radiation parameter on the second channel under the first test condition and the second-type radiation parameters on the second channel under the other test conditions, the total Bluetooth radiation performance parameter of the terminal is determined. Through the above solution, under the circumstance that the Wi-Fi radiation parameters of the terminal under various test conditions are obtained by test, all that is needed is to measure the Bluetooth radiation parameter under one test condition when the terminal is in the Bluetooth operation mode, and all Bluetooth radiation parameters under remaining of the respective test conditions can be obtained through calculation. Thus, the situation that the testing time is affected due to Bluetooth disconnection is avoided and the test efficiency of the Bluetooth radiation performance is improved.

Those of ordinary skill in the art will understand that the above described modules/units can each be implemented by hardware, or software, or a combination of hardware and software. Those of ordinary skill in the art will also understand that multiple ones of the above described modules/units may be combined as one module/unit, and each of the above described modules/units may be further divided into a plurality of sub-modules/sub-units.

In the present disclosure, it is to be understood that the terms "lower," "upper," "center," "longitudinal," "transverse," "length," "width," "thickness," "upper," "lower," "front," "back," "left," "right," "vertical," "horizontal," "top," "bottom," "inside," "outside," "clockwise," "counterclockwise," "axial," "radial," "circumferential," "column," "row," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the present disclosure, a first element being "on," "over," or "below" a second element may indicate direct contact between the first and second elements, without contact, or indirect through an intermediate medium, unless otherwise explicitly stated and defined.

Moreover, a first element being "above," "over," or "at an upper surface of" a second element may indicate that the first element is directly above the second element, or merely that the first element is at a level higher than the second element. The first element "below," "underneath," or "at a lower surface of" the second element may indicate that the first element is directly below the second element, or merely that the first element is at a level lower than the second feature. The first and second elements may or may not be in contact with each other.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

In some embodiments, the control and/or interface software or app can be provided in a form of a non-transitory computer-readable storage medium having instructions stored thereon is further provided. For example, the non-transitory computer-readable storage medium may be a Read-Only Memory (ROM), a Random-Access Memory (RAM), a Compact Disc Read-Only Memory (CD-ROM), a magnetic tape, a floppy disk, optical data storage equipment, a flash drive such as a USB drive or an SD card, and the like.

Implementations of the subject matter and the operations described in this disclosure can be implemented in digital electronic circuitry, or in computer software, firmware, or hardware, including the structures disclosed herein and their structural equivalents, or in combinations of one or more of them. Implementations of the subject matter described in this disclosure can be implemented as one or more computer programs, i.e., one or more modules of computer program instructions, encoded on one or more computer storage medium for execution by, or to control the operation of, data processing apparatus.

Alternatively, or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them.

Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, drives, or other storage devices). Accordingly, the computer storage medium may be tangible.

The operations described in this disclosure can be implemented as operations performed by a data processing apparatus on data stored on one or more computer-readable storage devices or received from other sources.

The devices in this disclosure can include special purpose logic circuitry, e.g., an FPGA (field-programmable gate array), or an ASIC (application-specific integrated circuit). The device can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The devices and execution environment can realize various different computing model infrastructures, such as web services, distributed computing, and grid computing infrastructures. For example, the devices can be controlled remotely through the Internet, on a smart phone, a tablet computer or other types of computers, with a web-based graphic user interface (GUI).

A computer program (also known as a program, software, software application, app, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a mark-up language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this disclosure can be performed by one or more programmable processors executing one or more computer programs to perform actions by operating on input data and generating output. The processes and logic flows can also be performed by, and apparatus can also be implemented as, special purpose logic circuitry, e.g., an FPGA, or an ASIC.

Processors or processing circuits suitable for the execution of a computer program include, by way of example, both general and special purpose microprocessors, and any one or more processors of any kind of digital computer. Generally, a processor will receive instructions and data from a read-only memory, or a random-access memory, or both. Elements of a computer can include a processor configured to perform actions in accordance with instructions and one or more memory devices for storing instructions and data.

Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented with a computer and/or a display device, e.g., a VR/AR device, a head-mount display (HMD) device, a head-up display (HUD) device, smart eyewear (e.g., glasses), a CRT (cathode-ray tube), LCD (liquid-crystal display), OLED (organic light-emitting diode) display, a flexible display, or any other monitor for displaying information to the user and a keyboard, a pointing device, e.g., a mouse, trackball, etc., or a touch screen, touch pad, etc., by which the user can provide input to the computer.

Other types of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In an example, a user can speak commands to the audio processing device, to perform various operations.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombinations.

Moreover, although features may be described above as acting in certain combinations and even initially claimed as such, one or more features from a claimed combination can in some cases be excised from the combination, and the claimed combination may be directed to a subcombination or variations of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A method for testing Bluetooth radiation performance of a terminal, wherein an antenna circuit used when the terminal operates in a Wi-Fi 2.4G mode is same as an antenna circuit used when the terminal operates in a Bluetooth mode, and the method comprises:
when the terminal operates in the Wi-Fi 2.4G mode, acquiring first-type radiation parameters on a first channel under respective test conditions, wherein the test conditions comprise a channel polarization direction and a spatial position of a test point with respect to the terminal;
when the terminal operates in the Bluetooth mode, acquiring a second-type radiation parameter on a second channel under a first test condition, wherein the first test condition is any test condition in the respective test conditions;
according to the first-type radiation parameters on the first channel under the respective test conditions, and the second-type radiation parameter on the second channel under the first test condition, determining second-type radiation parameters on the second channel under other test conditions when the terminal is operated in the Bluetooth mode, wherein the other test conditions comprise remaining test conditions other than the first test condition in the respective test conditions; and
according to the second-type radiation parameter on the second channel under the first test condition and the second-type radiation parameters on the second channel under the other test conditions, determining total Bluetooth radiation performance parameters of the terminal.

2. The method according to claim 1, wherein
the channel polarization direction comprises a horizontal polarization direction and a vertical polarization direction; and
the spatial position of the test point with respect to the terminal comprises an angle of the test point in a horizontal direction with respect to the terminal, and an angle of the test point in a vertical direction with respect to the terminal.

3. The method according to claim 2, further comprising, before acquiring a second-type radiation parameter on a second channel under a first test condition when the terminal operates in the Bluetooth mode:
determining a target parameter from the first-type radiation parameters on the first channel under the respective test conditions; and
acquiring a test condition corresponding to the target parameter as the first test condition.

4. The method according to claim 1, further comprising, before acquiring a second-type radiation parameter on a second channel under a first test condition when the terminal operates in the Bluetooth mode:
determining a target parameter from the first-type radiation parameters on the first channel under the respective test conditions; and
acquiring a test condition corresponding to the target parameter as the first test condition.

5. The method according to claim 4, wherein determining the target parameter from the first-type radiation parameters on the first channel under the respective test conditions comprises:
determining a maximum value among the first-type radiation parameters on the first channel under the respective test conditions as the target parameter.

6. The method according to claim 4, wherein according to the first-type radiation parameters on the first channel under the respective test conditions, and the second-type radiation parameter on the second channel under the first test condition, determining second-type radiation parameters on the second channel under other test conditions when the terminal operates in the Bluetooth mode comprises:
determining a parameter ratio of a first-type radiation parameter on the first channel under the first test condition to the second-type radiation parameter on the second channel under the first test condition; and
determining the second-type radiation parameters on the second channel under the other test conditions according to the parameter ratio and the first-type radiation parameters on the first channel under the other test conditions.

7. The method according to claim 6, wherein
the first-type radiation parameters and the second-type radiation parameters are effective isotropic radiated power; and the total Bluetooth radiation performance parameter is Bluetooth total radiated power;
or
both the first-type radiation parameters and the second-type radiation parameters are effective isotropic sensitivity; and the total Bluetooth radiation performance parameters are Bluetooth total isotropic sensitivity.

8. The method according to claim 1, wherein
a test environment for the first-type radiation parameters on the first channel under the respective test conditions is same as a test environment for the second-type radiation parameter on the second channel under the first test condition.

9. The method according to claim 1, wherein
a difference value between frequencies corresponding to the first channel and the second channel is less than a specified difference value.

10. The method according to claim 9, wherein
the first channel is channel 1 in the Wi-Fi 2.4G mode and the second channel is channel 0 in the Bluetooth mode; or
the first channel is channel 6 in the Wi-Fi 2.4G mode or channel 7 in the Wi-Fi 2.4G mode, and the second channel is channel 39 in the Bluetooth mode; or
the first channel is channel 11 in the Wi-Fi 2.4G mode or channel 13 in the Wi-Fi 2.4G mode, and the second channel is channel 78 in the Bluetooth mode.

11. An apparatus configured to test Bluetooth radiation performance of a terminal, wherein an antenna circuit used when the terminal operates in a Wi-Fi 2.4G mode is same as an antenna circuit used when the terminal operates in a Bluetooth mode, and the apparatus comprises:
a processor; and
a memory for storing a processor-executable instruction, wherein
the processor is configured to:
when the terminal operates in the Wi-Fi 2.4G mode, acquire first-type radiation parameters on a first channel under respective test conditions, wherein the test conditions comprise a channel polarization direction and a spatial position of a test point with respect to the terminal;
when the terminal operates in the Bluetooth mode, acquire a second-type radiation parameter on a second channel under a first test condition, wherein the first test condition is one of test condition in the respective test conditions;
according to the first-type radiation parameters on the first channel under the respective test conditions and the second-type radiation parameter on the second channel under the first test condition, determine second-type radiation parameters on the second channel under other test conditions when the terminal operates in the Bluetooth mode, wherein the other test conditions comprise various other test conditions other than the first test condition in the various test conditions; and
according to the second-type radiation parameter on the second channel under the first test condition and the second-type radiation parameters on the second channel under the other test conditions, determine a total Bluetooth radiation performance parameter of the terminal.

12. The apparatus according to claim 11, wherein
the channel polarization direction comprises a horizontal polarization direction and a vertical polarization direction; and
the spatial position of the test point with respect to the terminal comprises an angle of the test point in a horizontal direction with respect to the terminal, and an angle of the test point in a vertical direction with respect to the terminal.

13. The apparatus according to claim 11, wherein, before configured to acquire a second-type radiation parameter on a second channel under a first test condition when the terminal operates in the Bluetooth mode, the processor is configured to:
determine a target parameter from the first-type radiation parameters on the first channel under the respective test conditions; and
acquire a test condition corresponding to the target parameter as the first test condition.

14. The apparatus according to claim 13, wherein when configured to determine the target parameter from the first-type radiation parameters on the first channel under the respective test conditions, the processor is configured to:
determine a maximum value among the first-type radiation parameters on the first channel under the respective test conditions as the target parameter.

15. The apparatus according to claim 13, wherein when configured to determine second-type radiation parameters on the second channel under other test conditions when the terminal operates in the Bluetooth mode comprises, according to the first-type radiation parameters on the first channel under the respective test conditions, and the second-type radiation parameter on the second channel under the first test condition, the processor is configured to:
determine a parameter ratio of a first-type radiation parameter on the first channel under the first test condition to the second-type radiation parameter on the second channel under the first test condition; and
determine the second-type radiation parameters on the second channel under the other test conditions according to the parameter ratio and the first-type radiation parameters on the first channel under the other test conditions.

16. The apparatus according to claim 15, wherein
the first-type radiation parameters and the second-type radiation parameters are effective isotropic radiated power; and the total Bluetooth radiation performance parameter is Bluetooth total radiated power; or
both the first-type radiation parameters and the second-type radiation parameters are effective isotropic sensitivity; and the total Bluetooth radiation performance parameters are Bluetooth total isotropic sensitivity.

17. The apparatus according to claim 11, wherein a test environment for the first-type radiation parameters on the first channel under the respective test conditions is same as a test environment for the second-type radiation parameter on the second channel under the first test condition.

18. The method according to claim 11, wherein a difference value between frequencies corresponding to the first channel and the second channel is less than a specified difference value.

19. The apparatus according to claim 18, wherein
the first channel is channel 1 in the Wi-Fi 2.4G mode and the second channel is channel 0 in the Bluetooth mode; or
the first channel is channel 6 in the Wi-Fi 2.4G mode or channel 7 in the Wi-Fi 2.4G mode, and the second channel is channel 39 in the Bluetooth mode; or
the first channel is channel 11 in the Wi-Fi 2.4G mode or channel 13 in the Wi-Fi 2.4G mode, and the second channel is channel 78 in the Bluetooth mode.

20. A non-transitory computer-readable storage medium having instructions stored thereon for execution by a processor to implement a method for testing Bluetooth radiation performance of a terminal, when the instruction is executed by the processor, the processor is configured to:
when the terminal operates in the Wi-Fi 2.4G mode, acquire first-type radiation parameters on a first channel under respective test conditions, wherein the test conditions comprise a channel polarization direction and a spatial position of a test point with respect to the terminal;

when the terminal operates in the Bluetooth mode, acquire a second-type radiation parameter on a second channel under a first test condition, wherein the first test condition is one of test condition in the respective test conditions;

according to the first-type radiation parameters on the first channel under the respective test conditions and the second-type radiation parameter on the second channel under the first test condition, determine second-type radiation parameters on the second channel under other test conditions when the terminal operates in the Bluetooth mode, wherein the other test conditions comprise various other test conditions other than the first test condition in the various test conditions; and according to the second-type radiation parameter on the second channel under the first test condition and the second-type radiation parameters on the second channel under the other test conditions, determine a total Bluetooth radiation performance parameter of the terminal.

* * * * *